(12) United States Patent
Spitzl et al.

(10) Patent No.: US 6,204,603 B1
(45) Date of Patent: Mar. 20, 2001

(54) COAXIAL RESONATOR MICROWAVE PLASMA GENERATOR

(75) Inventors: Ralf Spitzl, Niederscheuren 27a, D-53639 Konigswinter; Benedikt Aschermann, Wuppertal, both of (DE)

(73) Assignee: Ralf Spitzl, Konigswinter (DE)

( * ) Notice: Subject to any disclaimer, the term of this patent is extended or adjusted under 35 U.S.C. 154(b) by 0 days.

(21) Appl. No.: 09/142,513

(22) PCT Filed: Mar. 3, 1997

(86) PCT No.: PCT/EP97/01114

§ 371 Date: Feb. 22, 1999

§ 102(e) Date: Feb. 22, 1999

(87) PCT Pub. No.: WO97/33299

PCT Pub. Date: Sep. 12, 1997

(30) Foreign Application Priority Data

Mar. 8, 1996 (DE) .............................................. 196 08 949

(51) Int. Cl.[7] ...................................................... H05H 1/46
(52) U.S. Cl. ................................ 315/111.21; 118/723 MW

(58) Field of Search ........................... 315/111.21, 111.41; 118/723 MW, 723 ME, 723 MR, 723 MA; 156/345

(56) References Cited

U.S. PATENT DOCUMENTS

| | | | | |
|---|---|---|---|---|
| 3,577,207 | * | 5/1971 | Kirjushin | 215/111.21 X |
| 5,487,875 | * | 1/1996 | Suzuki | 315/111.21 X |
| 5,517,085 | * | 5/1996 | Engemann et al. | 315/111.21 |

FOREIGN PATENT DOCUMENTS

| | | |
|---|---|---|
| 1960022 | 7/1997 | (DE) . |
| 0 564 359 | * 10/1993 | (EP) . |

* cited by examiner

Primary Examiner—Justin P. Bettendorf
(74) Attorney, Agent, or Firm—D. Peter Hochberg; Katherine R. Vieyra; William H. Holt

(57) ABSTRACT

In a device for the production of powerful microwave plasmas, the resonator is designed as a coaxial resonator with inner and outer conductors. The microwaves are coupled into the plasma chamber via the boundaries of the coaxial resonator.

9 Claims, 5 Drawing Sheets

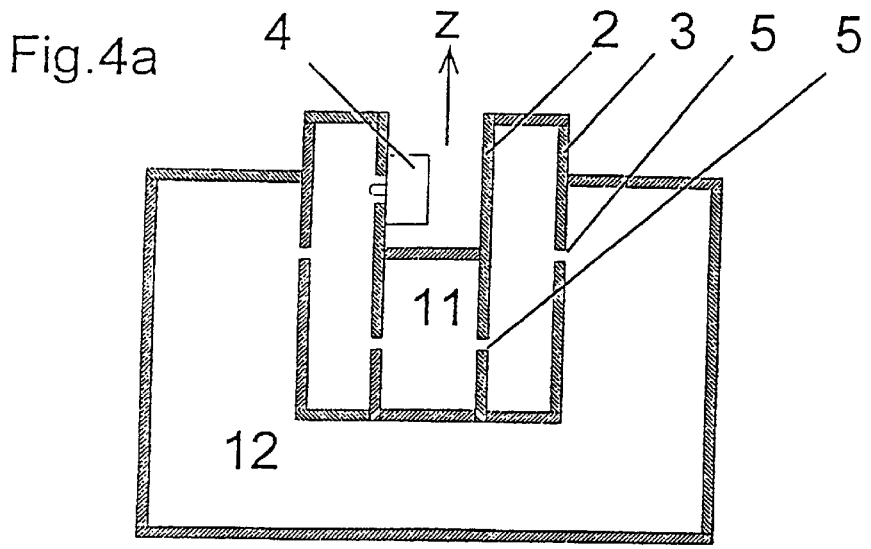
Fig. 4a
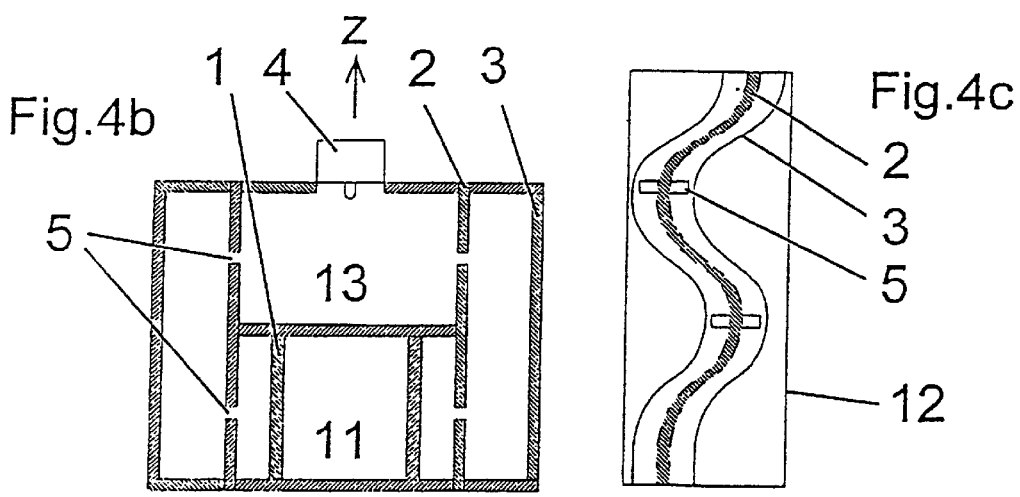
Fig. 4b
Fig. 4c
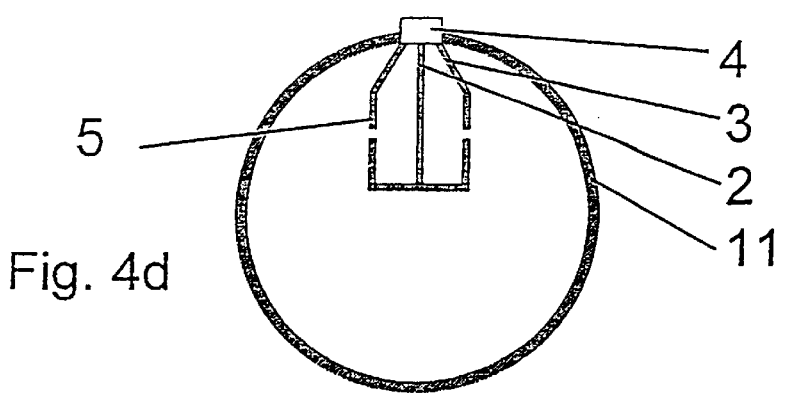
Fig. 4d

COAXIAL RESONATOR MICROWAVE PLASMA GENERATOR

CROSS REFERENCE TO RELATED APPLICATIONS

This application claims priority to International Patent Application PCT/EP97/01114, filed Mar. 3, 1997 and to DE 196 08 949.2, filed Mar. 8, 1996.

BACKGROUND OF THE INVENTION

Microwave plasmas are employed in technical fields such as, for example, the manufacture or processing of components, in microelectronics, during coating, in the decomposition of gases, synthesis or cleaning of materials.

In the devices, the microwaves are fed by means of coupling points into the plasma chamber, together with the container, i.e. working space, which it may optionally contain, from a microwave generator optionally via a feed to a waveguide resonator around the plasma chamber. It is customary, in particular, to use ring resonators, i.e. waveguide resonators which are designed as a ring and have a short length along their axis in comparison with the relatively large cross-sectional diameter of the resonator ring. It is common for the axis of the ring resonator and the axis of the plasma chamber, in this case for example designed as a tube, to have the same or a common z axis.

According to DE 196 00 223.0-33, the resonator ring has a rectangular cross-section, and the coupling points are, for example, in the form of slots in the short cross-sectional side. Devices of this type for the production of microwave plasmas have high efficiency. However, there is a need for more uniform and more powerful plasma chambers and more simply configured devices.

BRIEF SUMMARY OF THE INVENTION

The invention relates to a device for the production of microwave plasmas, whose resonator is designed as a coaxial resonator with inner and outer conductors. Insofar as the conductors fully or partially form the inner and outer boundaries of the resonator, the shape of the latter and the shape of the conductors is arbitrary. It is preferable if the two conductors have an axial direction which is similar, of the same type or identical, or if they have a common z axis. Surprisingly, a vacuum is not absolutely necessary during operation of the device.

BRIEF DESCRIPTION OF THE DRAWINGS

The invention will be explained by illustrative embodiments in the drawings.

FIGS. 4a–d outlines further illustrative embodiments of the invention.

FIG. 5a shows an embodiment in which the inner wall (2) is provided with rod antennas (14) as coupling points. FIG. 5b illustrates an embodiment in which the inner wall (2) is provided with loops (15) as coupling points. FIG. 5c shows an embodiment in which the inner wall (2) is provided with gaps (16) as coupling points.

DETAILED DESCRIPTION OF THE INVENTION

Figure 1:
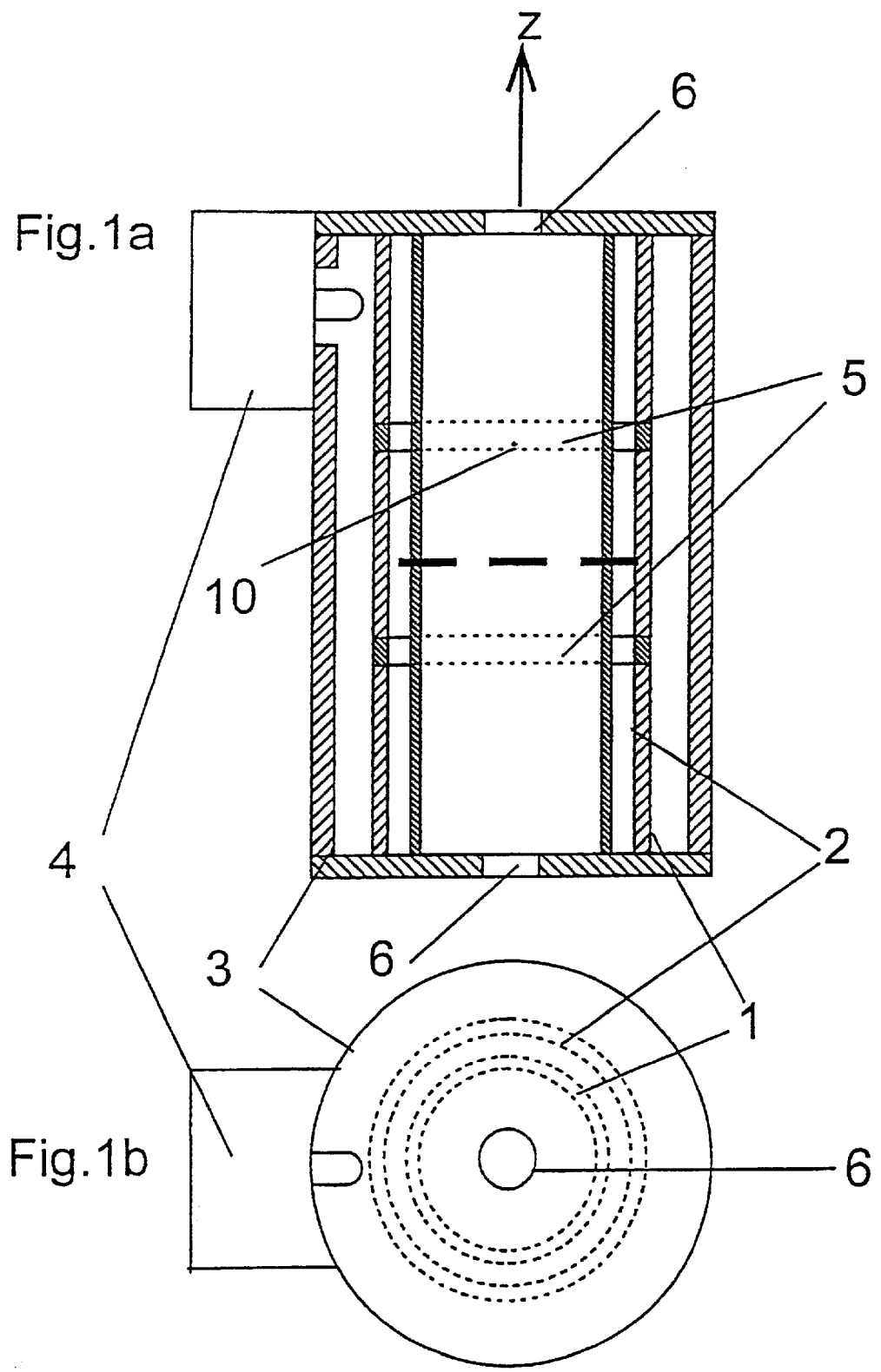
FIG. 1a shows a sectional view of the present invention along the z-axis.
FIG. 1b is an illustration of the associated plan view.

It is made from hollow sections, preferably for example rolled sections, of the elongate type which are arranged inside on another as a coaxial conductor and may be closed or open at their ends. Two tubes or cylinders with an arbitrary, including angular base face, which are arranged inside one another, represent examples which are easy to form. It is preferred to have a wire or solid cylinder as the inner conductor if coupling takes place only via the outer conductor.

The resonator might have essentially the same axis in the z direction as the plasma chamber and, along the z direction, the resonator and plasma chamber may be designed with equal length or unequal length.

It is also possible for the apparatus to contain several of all the components.

The invention thus departs from a narrow-designed resonator ring with different cross-section, which fits around the plasma chamber, for example designed as a resonator, as a ring fits round the finger of a hand. Instead of this, the coaxial resonator is, according to the invention, elongate and may, for example, be designed as a sleeve, like the space in the finger of a glove around the finger of a hand, over essentially the full length in the direction of the z axis. According to the invention, the plasma chamber and resonator are not restricted to a specific shape of the cavities. It is highly preferable for the inner and outer conductors of the coaxial resonator essentially to have the same direction essentially for their long or longest axis, referred to as the z axis. Preferably, the corresponding direction of the axes of the chamber and coaxial resonator is a common or parallel axis, although it is also possible to have a small angle or a tilt of up to 90° between the axes of the two components.

It is possible to have coaxial conductors made of flexible metal tubes, for example in the form of coiled strips or interlocking rings, the resonator being formed by two tubes arranged inside one another, or one tube wound around, for example, a tubular or ovoid chamber as one of the conductors. The wall of the plasma chamber may constitute one of the conductors, the shape of the plasma chamber being arbitrary, but design in the form of a tube, sphere or cylinder being always preferable.

In all cases, the chamber and resonator may be of equal or unequal length, it being possible to form one or even more chambers, one or more coaxial resonators or divided chambers or coaxial resonators, for example perpendicular to the preferential direction.

Coupling points, for example in the form of antennas, rod antennas or loops, preferably, in the form of slots or gaps, may be arranged on the walls of the coaxial resonator, that is to say on the walls common with the chamber, in an arbitrary number, preferably with the number, geometry and arrangement needed for the respectively chosen plasma mode.

Coupling points with small dimensions do not substantially perturb the resonance in the coaxial resonator. Coupling points of this type, and a relatively large number of coupling points, permit the frequently preferred homogeneous formation of the plasma in the plasma chamber, and resonance in the chamber in the case of suitable dimensions.

The microwave source may be arranged directly, via an optionally controlled feed or via a further resonator, at an arbitrary point on the coaxial resonator, including on the inner boundary, and may couple into one or more plasma chambers. The plasma chamber, as well as the coaxial resonator, may fully or partially contain a dielectric material such as, for example, ceramic, quartz glass or Teflon.

According to this invention, there is no longer the need to arrange the chamber only inside the resonator. It is possible to have an inner chamber arranged fully or partially in the inner conductor, as well as an outer chamber and, optionally, both one or more outer chambers and one or more inner chambers, with a respective working space or container arranged therein with dielectric walls of arbitrary configuration.

The coaxial resonator of the invention thus makes it possible to have a wide variety of configurations and designs. The plasma chamber may be an additional resonator or part thereof. It is in this case preferred to design the plasma chamber as a cylinder resonator and to have the associated form of particular modes. It is possible to form a plurality of microwave feeds to one or more coaxial resonators.

Particular technical and geometrical designs of the device are particularly suitable for the modes of the respective type. The preferred coaxial modes TEM or $TM_{n1}$ are formed optimally in the coaxial resonator between two preferably cylindrical electrically conducting tubes with different diameters. It is also possible to have any of the $TE_{nm}$ or $TM_{nm}$ field distributions in them. The length of the two tubes is preferably equal to a multiple of half the propagation wavelength of the microwave which is used. The two ends of the tubes then have electrically conducting terminations, for example using a wall, gas-permeable grid or short-circuit disc.

The container or containers, as usual made of dielectric material, may according to the invention have a large volume and, when divided, serve several purposes. In the case of a large externally arranged container, it is not absolutely necessary to have a metallic closure wall.

Permanent magnets or coil arrangements, for example according to Helmholz, around the respective outer tube or the metal outer wall, permit the conditions for electron cyclotron resonance plasmas in the chamber. It is likewise possible to have an arrangement of magnets in the inner conductor of the coaxial resonator.

FIG. 1a shows a section through a device along the z axis, and in FIG. 1b the associated plan view. A device is represented with an inner wall 2 and outer wall 3 of a tubular coaxial resonator with a microwave source 4, which couples into the resonator between 2 and 3, and a container 1. In FIG. 1, two coupling slots 5 are formed as circumferential slots in the inner wall 2; they are therefore perpendicular to the z axis of the device. The coaxial resonator and the plasma chamber, which lies inside and is designed as a cylinder resonator, have equal length in the z direction in this illustrative embodiment. 10 is an optional, for example metallic, grid which divides the plasma chamber into two chambers. Openings 6 for feeding and discharging process gases, for example, are indicated in the upper and lower closure walls of the plasma chamber.

Figure 2:
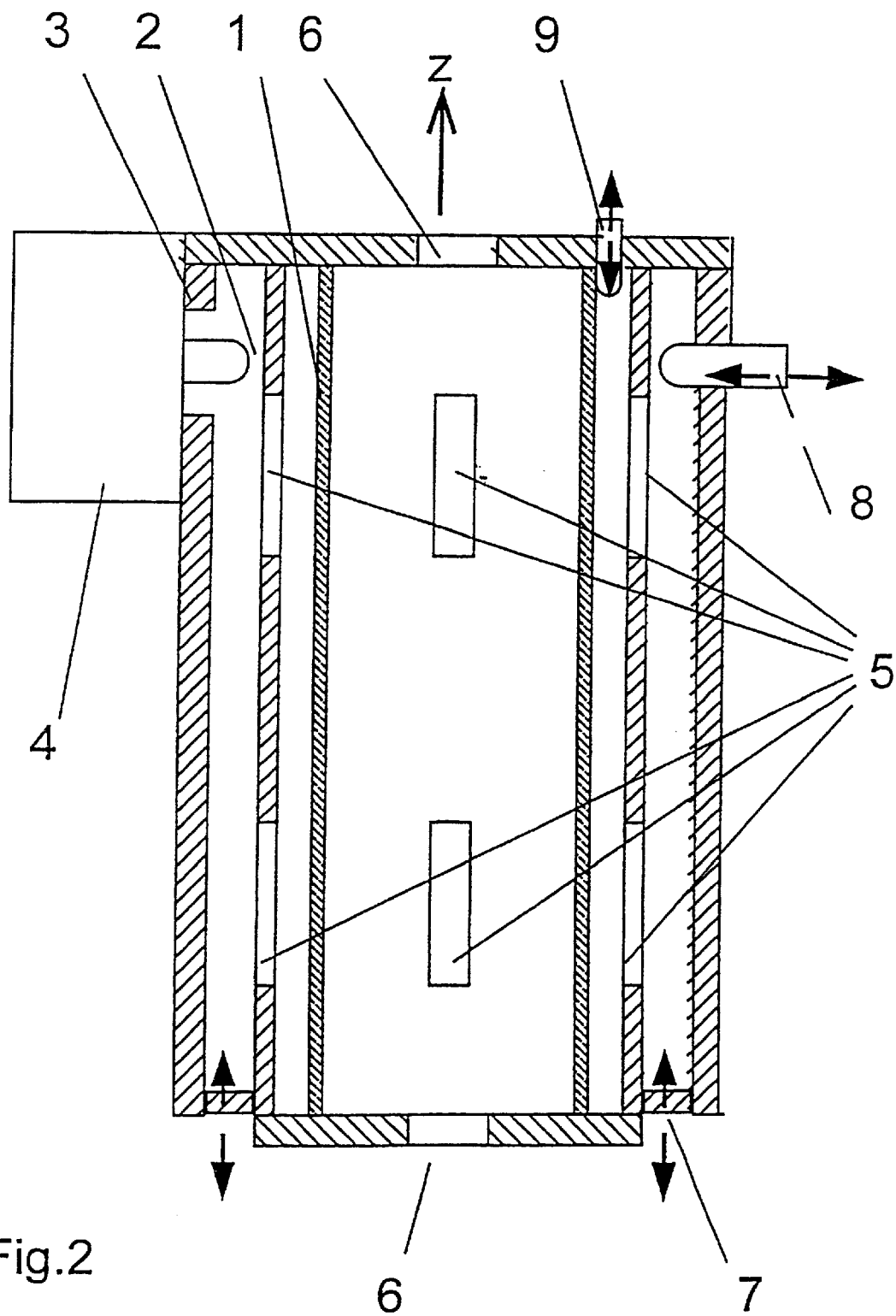
FIG. 2 illustrates an alternative embodiment of the present invention wherein coupling points are arranged in the form of longitudinal slots in the wall of the inner coaxial conductor.

FIG. 2 shows a similar device to FIG. 1, but in this case the coupling points 5 are arranged in the form of longitudinal slots in the wall of the inner coaxial conductor, and therefore run parallel to the z axis of the device. Furthermore, FIG. 2 includes a few examples of possibilities for tuning the coaxial resonator and plasma chamber. The closure disc 7 is used for tuning the coaxial resonator. The tuning pin or screw 8 serves the same purpose. The position and number of tuning elements of this type may be varied as required. The tuning pin 9 represents a possibility for tuning the plasma chamber. A closure disc (not shown here) which varies the length of the plasma chamber also has a similar function. The arrows in the figure indicate the direction in which the tuning elements move.

Figure 3:
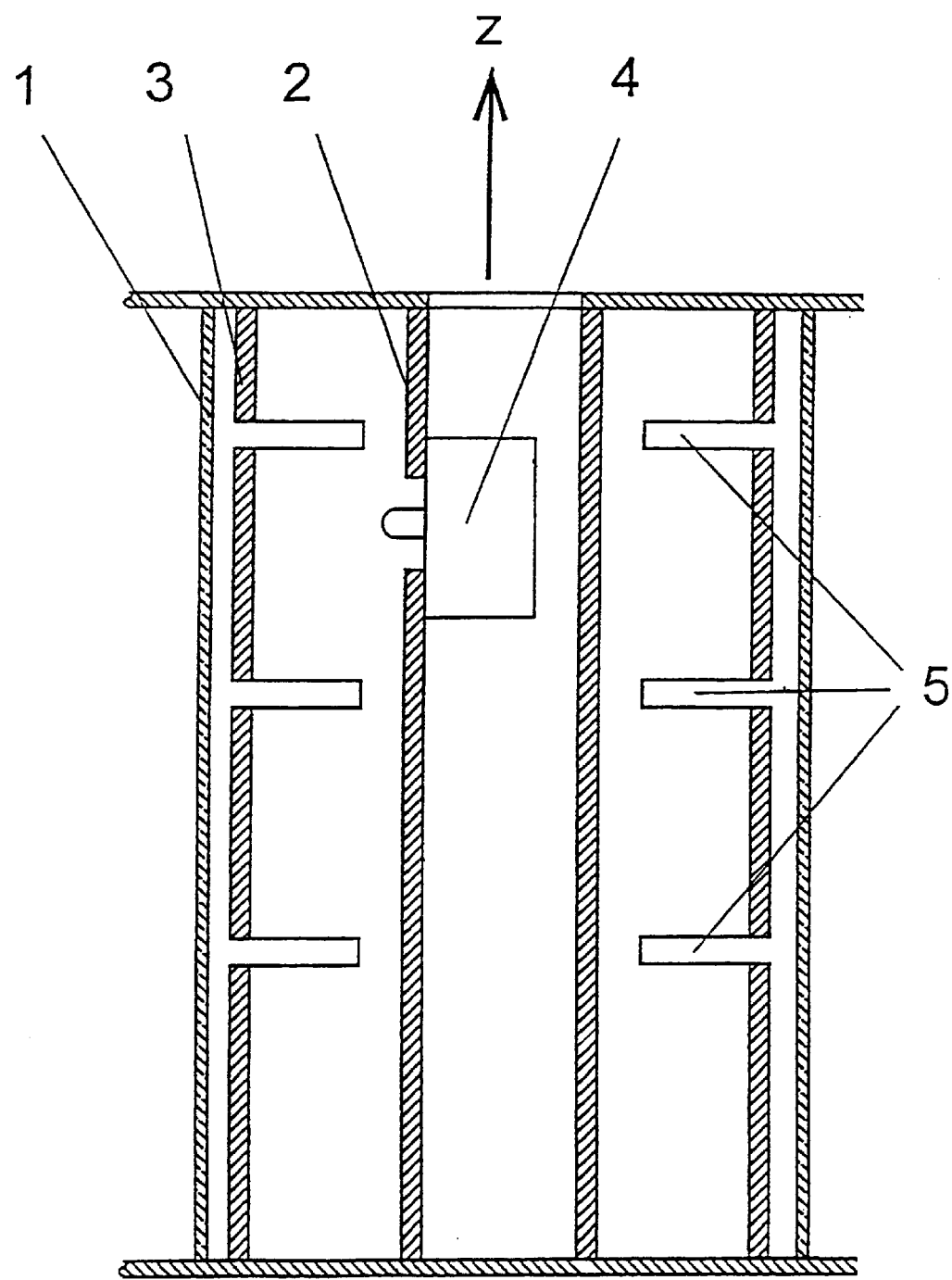
FIG. 3 is a schematic representation of an embodiment having an external plasma chamber.
Figure 5A:
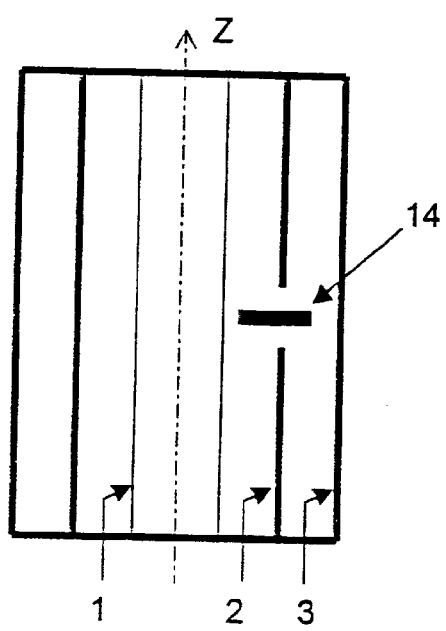
FIGS. 5a–c show sectional views of devices similar to those illustrated in FIGS. 1a and 1b and 2. For sake of clarity, the wave source (4) has been omitted in these diagrams. The illustrated devices comprise a container (1), an inner wall (2) and an outer wall (3).
Figure 5B:
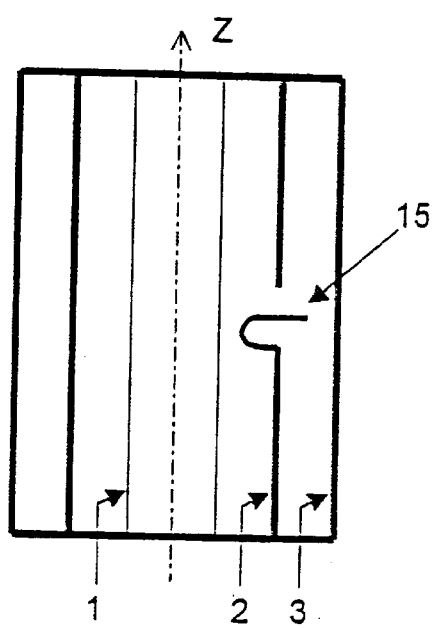
Figure 5C:
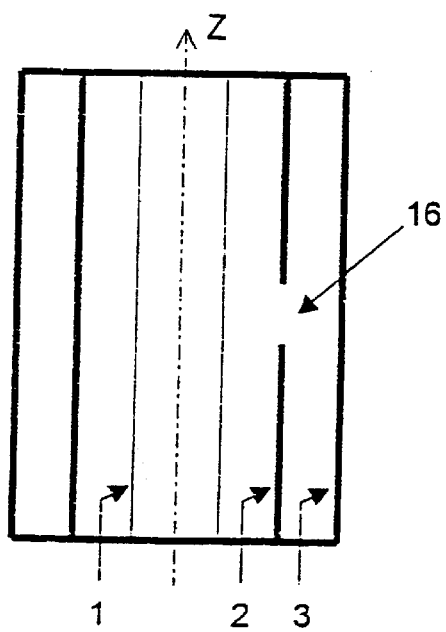

FIG. 3 shows a detail of a device with an external plasma chamber, not fully represented here. The microwave generator 4 is fitted in the interior of the inner conductor 2 of the coaxial resonator. The coupling points 5 are designed as three azimuthal, partially circumferential coupling slots in the outer wall of the coaxial resonator.

FIGS. 4a–d outlines further illustrative embodiments of the invention, FIG. 4a representing a section through a device having both an inner plasma chamber 11 and an external plasma chamber 12. If required, the plasma chambers 11, 12 may be equipped with containers.

FIG. 4b shows a section through a device in which the microwave is coupled directly into a cylinder resonator 13, and this resonator is coupled via a circumferential azimuthal slot with the coaxial resonator. Coupling into the plasma chamber 11, designed as a further cylinder resonator, with the container 1 takes place via further coupling slots.

FIG. 4c shows a section through a device, in which a for example helically coiled coaxial resonator with an outer conductor 3, and a similarly coiled inner conductor 2, for example formed as a wire, lies inside a cylindrical chamber 12. It is likewise possible to have a structure in which the coaxial resonator, in coiled or wound form, fully or partially encloses a chamber with the outer conductor, that is to say is wound around a chamber in the manner, for example, of a tape or cord.

FIG. 4d shows a section through a device with a spherical plasma chamber 11. The antenna of the microwave generator 4 is directly connected to the inner conductor 2 of the coaxial resonator. The outer conductor 3 is tapered conically towards the microwave generator 4. The microwave power is coupled into the plasma chamber via an azimuthal coupling slot 5.

What is claimed is:

1. A device for the production of microwave plasmas, comprising a microwave generator, a feeding resonator with coupling points, a plasma chamber, and a coaxial resonator, wherein outer and inner boundaries of said feeding resonator comprise outer and inner conductors of said coaxial resonator.

2. A device according to claim 1, wherein the plasma chamber is fully or partially surrounded by the feeding resonator.

3. A device according to claim 1, wherein the feeding resonator is fully or partially surrounded by the plasma chamber.

4. A device according to claim 1, wherein one or more chambers are arranged inside and/or outside the feeding resonator, or the plasma chamber is divided.

5. A device according to claim 1, wherein the coaxial resonator and the plasma chamber are designed with equal length in the same preferential direction.

6. A device according to one or the preceding claims, wherein the coupling points for coupling the microwaves into or out of the resonator are arranged in or on the walls of the coaxial resonator, or in or on a common wall of the chamber and resonator.

7. A device according to one of claims 1–5, wherein the coupling points are selected from the group consisting of rod antennas (14), loops (15), slots (5) and gaps (16).

8. A device according to claim 1, wherein the coaxial resonator and the plasma chamber are designed with different lengths in the same preferential direction.

9. A device according to claim 1, further comprising one or more containers.

* * * * *